(12) United States Patent
Zhang et al.

(10) Patent No.: US 11,437,366 B2
(45) Date of Patent: Sep. 6, 2022

(54) TUNABLE PASSIVE SEMICONDUCTOR ELEMENTS

(71) Applicant: Intel Corporation, Santa Clara, CA (US)

(72) Inventors: Zhichao Zhang, Chandler, AZ (US); Kemal Aygun, Tempe, AZ (US); Yidnekachew S. Mekonnen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 16/643,553

(22) PCT Filed: Sep. 29, 2017

(86) PCT No.: PCT/US2017/054564
§ 371 (c)(1),
(2) Date: Feb. 29, 2020

(87) PCT Pub. No.: WO2019/066952
PCT Pub. Date: Apr. 4, 2019

(65) Prior Publication Data
US 2020/0203337 A1   Jun. 25, 2020

(51) Int. Cl.
*H01L 23/525* (2006.01)
*H01L 27/06* (2006.01)
(Continued)

(52) U.S. Cl.
CPC ...... *H01L 27/0629* (2013.01); *H01L 23/5222* (2013.01); *H01L 23/5227* (2013.01);
(Continued)

(58) Field of Classification Search
CPC ............ H01L 23/5256; H01L 23/5222; H01L 23/5228
See application file for complete search history.

(56) References Cited

U.S. PATENT DOCUMENTS

| 10,608,633 | B1 * | 3/2020 | Schreiber | ........... H03K 19/0002 |
| 2009/0079065 | A1 * | 3/2009 | Furgut | .................. H01L 23/481 |
| | | | | 257/E21.531 |

(Continued)

*Primary Examiner* — Errol V Fernandes
(74) *Attorney, Agent, or Firm* — Schwabe, Williamson & Wyatt P.C.

(57) ABSTRACT

Passive semiconductor components and switches may be formed directly in, on, about, or across each of two or more semiconductor dies included in a stacked-die semiconductor package. At least some of the passive semiconductor components and/or switches may be formed in redistribution layers operably coupled to corresponding semiconductor dies included in the stacked-die semiconductor package. The switches may have multiple operating states and may be operably coupled to the passive semiconductor components such that one or more passive semiconductor components may be selectively included in one or more circuits or excluded from one or more circuits. The switches may be manually controlled or autonomously controlled using one or more control circuits. The one or more control circuits may receive one or more input signals containing host system information and/or data that is used to adjust or set the operating state of at least some of the switches.

13 Claims, 7 Drawing Sheets

(51) Int. Cl.
*H01L 23/522* (2006.01)
*H01L 25/065* (2006.01)
*H01L 25/00* (2006.01)
*H01L 49/02* (2006.01)
*H01L 23/00* (2006.01)

(52) U.S. Cl.
CPC ...... *H01L 23/5228* (2013.01); *H01L 23/5256* (2013.01); *H01L 25/0657* (2013.01); *H01L 25/50* (2013.01); *H01L 28/10* (2013.01); *H01L 28/20* (2013.01); *H01L 28/40* (2013.01); *H01L 24/16* (2013.01); *H01L 2224/16145* (2013.01)

(56) References Cited

U.S. PATENT DOCUMENTS

2016/0211249 A1* 7/2016 Suwada .................. H01L 25/50
2016/0343685 A1* 11/2016 Lin ......................... H01L 24/92

* cited by examiner

TUNABLE PASSIVE SEMICONDUCTOR ELEMENTS

TECHNICAL FIELD

The present disclosure relates to technologies associated with passive semiconductor components.

BACKGROUND

On chip passive devices such as resistors, capacitors, and inductors find widespread use in both digital applications (peaking inductors, T-coils for high speed serializer/deserializers, etc.) and analog applications (filters, matching networks, etc.). Such passive devices are formed directly on the chip and frequently suffer from lower quality (Q) factors due to higher loss for on chip implementations. Further, such passive devices don't scale down proportionally with the Silicon technology nodes, thus consume valuable die real estate, leading to higher costs, particularly in newer node manufacturing processes. Once designed and fabricated, the values (resistance, capacitance, inductance) of these passive components are fixed and adjustment of the values is no longer possible. The values are also subject to manufacturing variations that may result in overall performance degradation.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
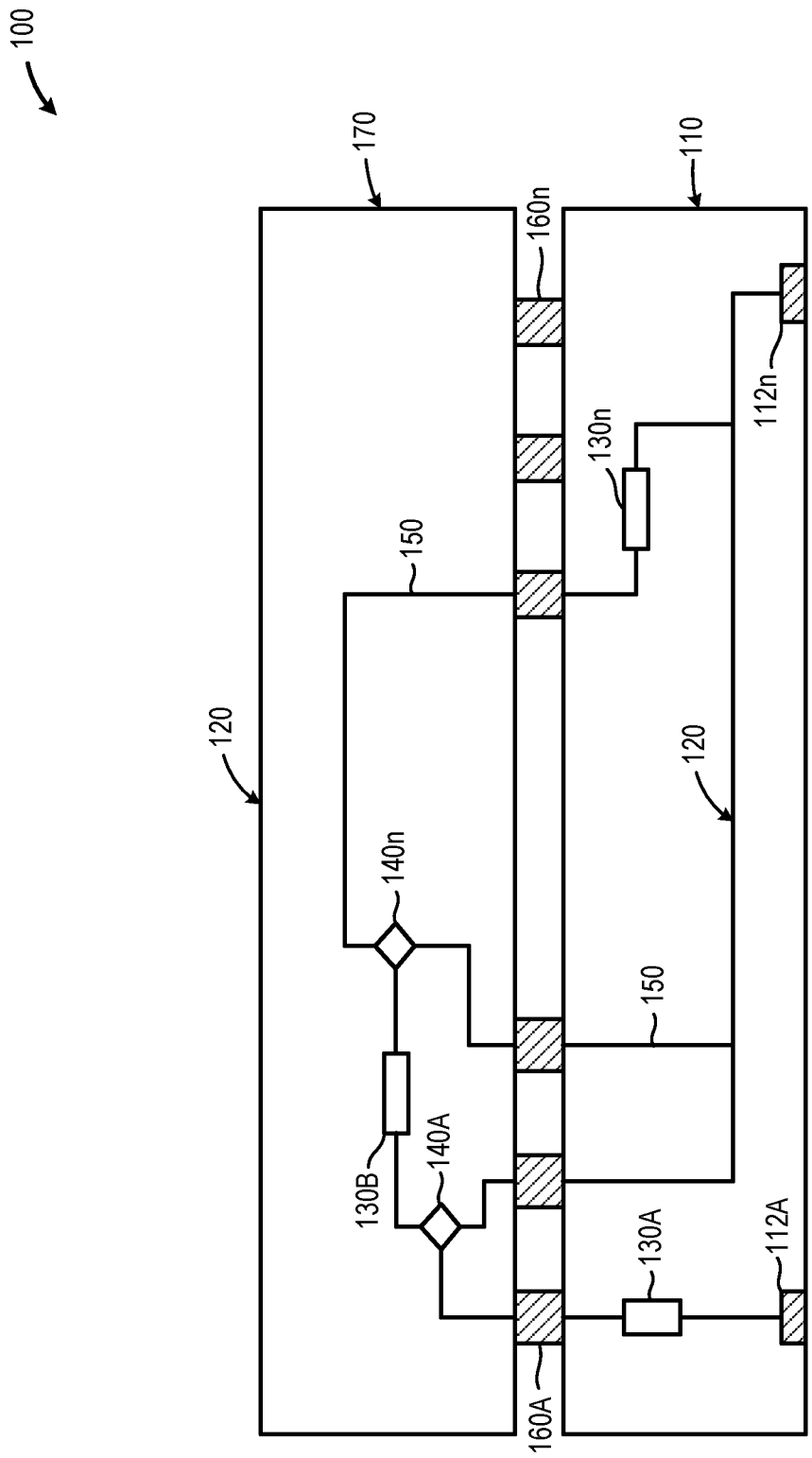
FIG. 1 is a schematic depicting an illustrative die stack that includes a first semiconductor die coupled via a number of interconnects to a second semiconductor die and in which each of the semiconductor dies includes one or more passive semiconductor components and one or more switches, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods described herein beneficially and advantageously provide for the selective deployment of passive semiconductor components to optimize circuit and semiconductor package performance. The systems and methods described herein beneficially and advantageously permit the formation of passive semiconductor components throughout a stacked semiconductor dies, thereby permitting design flexibility and optimizing use of die space within the semiconductor stack—no longer must a circuit be formed on a single die, instead various components may be formed on different dies throughout the stack and selectively switched in or out of the circuit. The systems and methods described herein beneficially permit the selective control of the passive semiconductor components using either hard (e.g., fuses) or soft (e.g., transistor) switches to permit post-manufacture tuning of the component's value (resistance, capacitance, inductance, etc.). Such tuning may compensate for the model/actual part discrepancy and manufacturing variability by permitting post-manufacture micro-adjustment. The systems and methods described herein may be used to implement any number of passive semiconductor components across any number of dies included in a 3D stacked die package. Further, the use of selectively switchable passive semiconductor components beneficially and advantageously reduces the number of circuits and components needed to support communication on multiple frequency bands such as in LTE/5G applications.

The systems and methods described herein may use of two-state (e.g., ON/OFF, ACTIVE/BYPASS) switches between individual passive semiconductor components or between defined groups of passive semiconductor components to permit post-manufacture tuning of circuits. The systems and methods described herein distribute the passive semiconductor devices partitioned to different dies representing different manufacturing processes to optimize utilization of die surface area and to reduce fabrication costs. The systems and methods disclosed herein represent different passive semiconductor component values, permitting selection of an appropriate component for a particular function.

A semiconductor is provided. The semiconductor may include: at least a first semiconductor die communicably coupled to a second semiconductor die; a circuit that includes a plurality of passive semiconductor components, at least some of the plurality of passive semiconductor components disposed across the first semiconductor die and at least some of the plurality of passive semiconductor components disposed across at second semiconductor die; wherein, in operation, at least some of the plurality of passive semiconductor components on at least one of: the first semiconductor die or the second semiconductor die are selectively transitionable between a first state and a second state; wherein the first state couples the passive semiconductor component to the circuit; and wherein the second state decouples the passive semiconductor component from the circuit.

A method of fabricating a semiconductor stacked die structure having selectively configurable passive semiconductor elements is provided. The method may include: forming a first passive semiconductor component in at least one of: a first semiconductor die or a first redistribution layer coupled to the first semiconductor die, the first passive semiconductor component selectively transitionable between a first state and a second state; forming a second passive semiconductor component in at least one of: a second semiconductor die or a second redistribution layer coupled to the second semiconductor die, the second passive semiconductor component selectively transitionable between a first state and a second state; forming at least one first switching element in at least one of: the first semiconductor die or the first redistribution layer, the at least one first switching element operably coupled to the first passive semiconductor component to selectively transition the first passive semiconductor component between the first state and the second state; and forming at least one second switching element in at least one of: the second semiconductor die or the second redistribution layer, the at least one second switching element operably coupled to the second passive semiconductor component to selectively transition the second passive semiconductor component between the first state and the second state; wherein the first state couples the respective passive semiconductor component to the circuit; and wherein the second state decouples the respective passive semiconductor component from the circuit; and operably coupling the first semiconductor die to the second semiconductor die.

A system for fabricating a semiconductor stacked die structure having selectively configurable passive semiconductor elements is provided. The system may include: means for forming a first passive semiconductor component in a first semiconductor die, the first passive semiconductor component selectively transitionable between a first state and a second state; means for forming a second passive semiconductor component in a second semiconductor die, the second passive semiconductor component selectively transitionable between a first state and a second state; means for operably coupling the first semiconductor die to the second semiconductor die to provide a semiconductor package; means for forming at least one first switching element in the semiconductor die, the at least one first switching element operably coupled to the first passive semiconductor component to selectively transition the first passive semiconductor component between the first state and the second state; and means for forming at least one second switching element in the semiconductor die, the at least one second switching element operably coupled to the second passive semiconductor component to selectively transition the second passive semiconductor component between the first state and the second state; where the first state couples the respective passive semiconductor component to the circuit; and where the second state decouples the respective passive semiconductor component from the circuit.

An electronic device is provided. The electronic device may include: a printed circuit board having operably coupled thereto: a semiconductor die stack that includes at least a first semiconductor die communicably coupled to a second semiconductor die; a circuit that includes a plurality of passive semiconductor components, at least some of the plurality of passive semiconductor components disposed across the first semiconductor die and at least some of the plurality of passive semiconductor components disposed across at second semiconductor die; where, in operation, at least some of the plurality of passive semiconductor components on at least one of: the first semiconductor die or the second semiconductor die are selectively transitionable between a first state and a second state; where the first state couples the passive semiconductor component to the circuit; where the second state decouples the passive semiconductor component from the circuit.

As used herein the terms "top," "bottom," "upper," "lower," "lowermost," and "uppermost" when used in relationship to one or more elements are intended to convey a relative rather than absolute physical configuration. Thus, an element described as an "upper film layer" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

As used herein the term "value" when used in conjunction with a passive semiconductor component refers to the intrinsic electrical properties of the component. Thus, the "value" for a resistor would include, but is not limited to, either or both the resistance value of the resistor and/or the tolerance value of the resistor. The "value" for a capacitor would include, but is not limited to, either or both the capacitance value of the capacitor and/or the tolerance value of the capacitor. Similarly, the "value" for an inductor would include, but is not limited to, either or both the inductance value of the inductor and/or the tolerance value of the inductor.

FIG. 1 is a schematic depicting an illustrative die stack 100 that includes a first semiconductor die 110 coupled via a number of interconnects 160A-160*n* to a second semiconductor die 170 and in which each of the semiconductor dies includes one or more passive semiconductor components 130A-130n (collectively, "passive semiconductor components 130") and one or more switching elements or switches 140A-140n (collectively, "switches 140"), in accordance with at least one embodiment described herein. A circuit may be formed by conductively coupling the passive semiconductor components 130 and switches 140 with one or more traces or similar conductors 150. The circuit may include passive semiconductor components 130 and/or switches 140 in a plurality of semiconductor dies included in the die stack 100. Although passive semiconductor components 130 and switches 140 are depicted as disposed in two dies within a die stack, one of ordinary skill in the relevant arts will readily appreciate that such passive semiconductor components 130 and switches 140 may be similarly disposed in, on, about, or across any number of semiconductor dies forming die stack 100.

Although the first semiconductor die 110 and the second semiconductor die 170 are depicted as stacked dies in FIG. 1, other configurations are possible. For example, an alternate arrangement may include the first semiconductor die 110 and the second semiconductor die 170 communicably coupled to a common substrate such as a redistribution layer that operably couples the semiconductor dies.

In embodiments, the passive semiconductor components 140 may include any number or combination of resistors, capacitors, and/or inductors. The passive semiconductor components 130 and switches 140 may be conductively coupled to form any number of series, parallel, or series/parallel circuits. In embodiments, at least some of the passive semiconductor components 140 may include a number of components, each having the same nominal electrical value (e.g., similar resistance, capacitance or inductance) and different electrical tolerances (e.g., ±5%, ±10%, ±20%). In embodiments, the passive semiconductor components 130 and switches 140 may be arranged or otherwise configured to conductively couple a number of similar types of components together to provide a desired electrical value. For example, at least some of the passive semiconductor components 130 may include resistors 130A-130n and switches 140A-140n coupled in series such that the any number of the resistors 130A-130n may be coupled in series (or, conversely, decoupled from a series circuit) to provide a desired resistance value. In another example, at least some of the passive semiconductor components may include capacitors 130A-130n and switches 140A-140n coupled in parallel such that the capacitors 130A-130n may be selectively coupled in parallel (or, conversely, decoupled from a parallel circuit) to provide a desired capacitance value. In yet another example, at least some of the passive semiconductor components 130 may include inductors 130A-130n and switches 140A-140n coupled in series such that the any number of the inductors 130A-130n may be coupled in series (or, conversely, decoupled from a series circuit) to provide a desired inductance value. The flexibility to switch passive semiconductor components 130 in and out of a circuit beneficially and advantageously permits the stacked die semiconductor package 100 to compensate for system performance, system power requirements, changes in component values based on age and/or temperature and similar.

At least some of the passive semiconductor components 130 and switches 140 may be conductively coupled such that the passive semiconductor components 130 form component groups. Switches 140 may then be deployed to conductively couple any number of such component groups to form one or more circuits 120. Such component groups may include any number of passive semiconductor components 130 arranged in any configuration. Such component groups may include passive semiconductor components 130 (e.g., inductors and capacitors) used to filter different frequency bands. In such an arrangement, one or more switches may be used to toggle between grouped component filters (e.g., LTE, 4G, 5G) based on the operational signal frequency.

In some embodiments, the passive semiconductor components 130 and/or switches 140 may be manually transitioned, positioned, set, and/or conductively coupled to form one or more circuits. In other embodiments, passive semiconductor components 130 and/or switches 140 may be autonomously transitioned between a first operational state or mode (e.g., ON or ACTIVE) and a second operational state or mode (e.g., OFF or SHUNTED) by one or more control circuits, processors, controllers, or microcontrollers. In some implementations, the one or more control circuits may be disposed in, on, about, or across one or more dies 110, 170 included in the same stacked-die semiconductor package 100 as the passive semiconductor components 130 and switches 140. In other implementations, the one or more control circuits may be disposed external to the stacked-die semiconductor package 100. In embodiments, the control circuitry may reversibly or irreversibly transition the passive semiconductor components 130 and/or switches 140 between the first state and the second state based, at least in part, on one or more system performance parameters, such as a desired processor or bus clock speed. In other embodiments, the control circuitry may reversibly or irreversibly transition the passive semiconductor components 130 and/or switches 140 between the first state and the second state based, at least in part, on one or more system operating parameters, such as system temperature, system configuration, and similar.

The switches 140 may include any number and/or combination of mechanical, electromechanical, solid-state, and/or semiconductor devices capable of being positioned in and/or transitioned between a first state and a second state. The switches 140 may include single pole/single throw (SPST) devices having a first, electrically continuous, mode and a second, electrically discontinuous, mode. The switches 140 may include selector switch devices having a single input and multiple outputs, each of which may be selectively conductively coupled to the single input. In embodiments, at least some of the switches 140 may include semiconductor transistor devices communicably coupled to control circuitry. In such embodiments, the control circuitry may selectively transition the transistor devices between the first state and the second state. In yet other embodiments, some or all of the switches 140 may include one or more fusible elements that are normally in a first, electrically conductive, mode but may be "blown" or converted to a second, OPEN, mode by the passage of a current greater than a defined threshold through the fusible element.

The first semiconductor die 110 and the second semiconductor die 170 may include any type and/or combination of semiconductor dies. For example, in one implementation, the semiconductor package 100 may be a system-on-a-chip (SoC) that includes, at least, one or more microprocessor or controller dies communicably coupled to one or more memory dies. In embodiments, at least some of the circuits 120 formed using the passive semiconductor components 130 and switches 140 may be conductively coupled to external devices using conductive pads 112A-112n or similar conductive appurtenances disposed in, on, about, or across the surface of one or more semiconductor dies. The first semiconductor die 110 and the second semiconductor die 170 may be communicably coupled by one or more electrically conductive interconnects 160.

Figure 2:
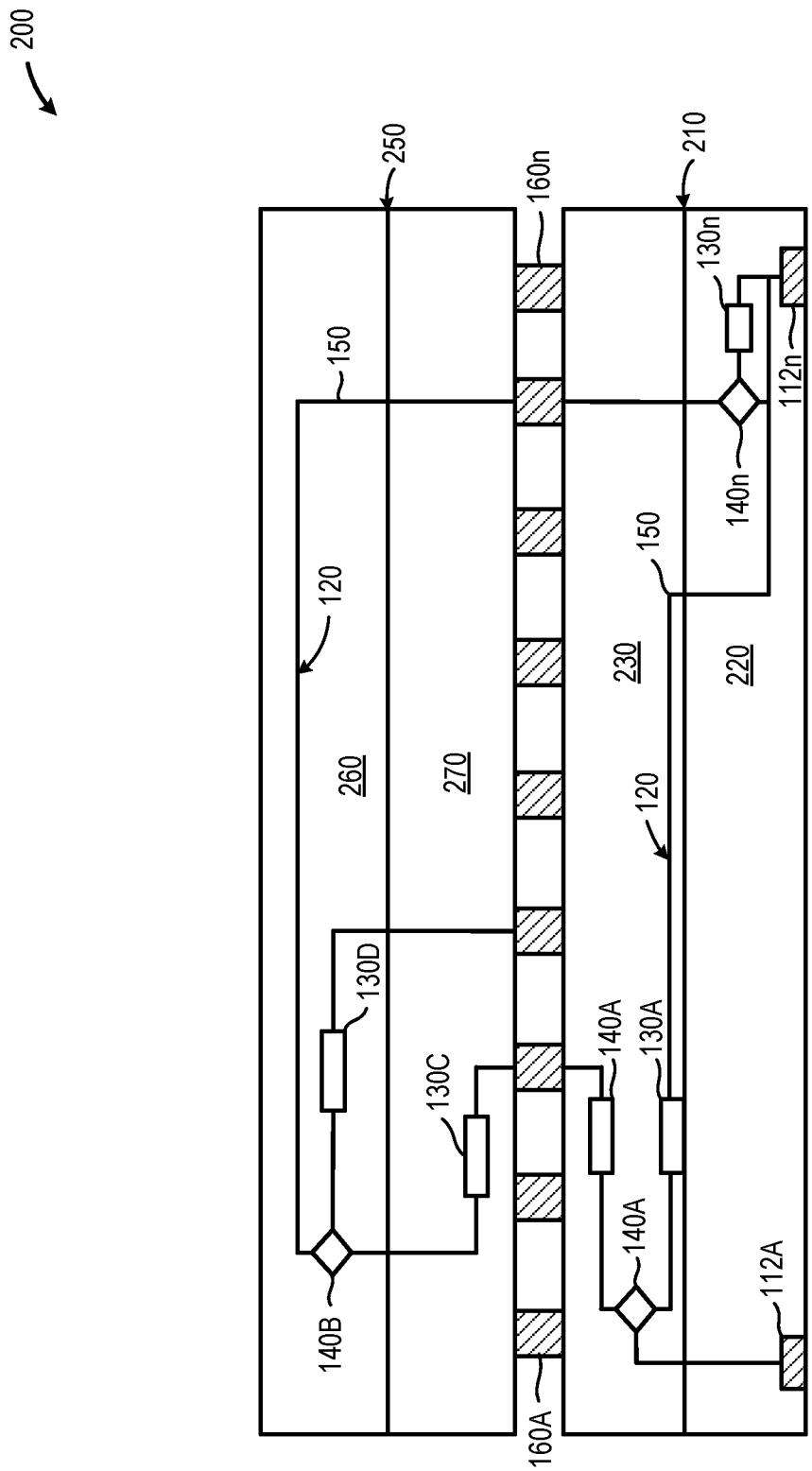
FIG. 2 is a schematic depicting an illustrative die stack that includes a first semiconductor die that includes a first semiconductor die and a first redistribution layer coupled via a number of interconnects to a second semiconductor die that includes a second semiconductor die and a second redistribution layer and in which each of the semiconductor dies and/or redistribution layers includes one or more passive semiconductor components and one or more switches, in accordance with at least one embodiment described herein.

FIG. 2 is a schematic depicting an illustrative die stack 200 that includes a first semiconductor package 210 that includes a first semiconductor die 220 and a first redistribution layer 230 coupled via a number of interconnects 160A-160n to a second semiconductor package 250 that includes a second semiconductor die 260 and a second redistribution layer 270 and in which each of the semiconductor packages and/or redistribution layers includes one or more passive semiconductor components 130A-130n (collectively, "passive semiconductor components 130") and one or more switches 140A-140n (collectively, "switches 140"), in accordance with at least one embodiment described herein. Although in FIG. 2 both the first semiconductor package 210 and the second semiconductor package 250 include redistribution layers, those of skill in the relevant arts will readily appreciate that some of the semiconductor dies included in the stacked-die semiconductor package 200 may include a redistribution layer while other semiconductor dies included in the stacked-die semiconductor package 200 may not include a redistribution layer.

The first redistribution layer 230 receives one or more outputs from the first semiconductor die 220 and includes a plurality of traces, conductive strips, or similar structures to reposition the one or more outputs to a location compatible with the second semiconductor package 250. In addition to repositioning or relocating the outputs from the first semiconductor die 220, the first redistribution layer 230 may include one or more passive semiconductor components 130 and/or one or more switches 140 forming one or more circuits 120.

The second redistribution layer 270 receives one or more outputs from the second semiconductor die 260 and includes a plurality of traces, conductive strips, or similar structures to reposition the one or more outputs to a location compatible with the first semiconductor package 210. In addition to repositioning or relocating the outputs from the second semiconductor die 260, the second redistribution layer 270 may include one or more passive semiconductor components 130 and/or one or more switches 140 forming one or more circuits 120.

Figure 3:
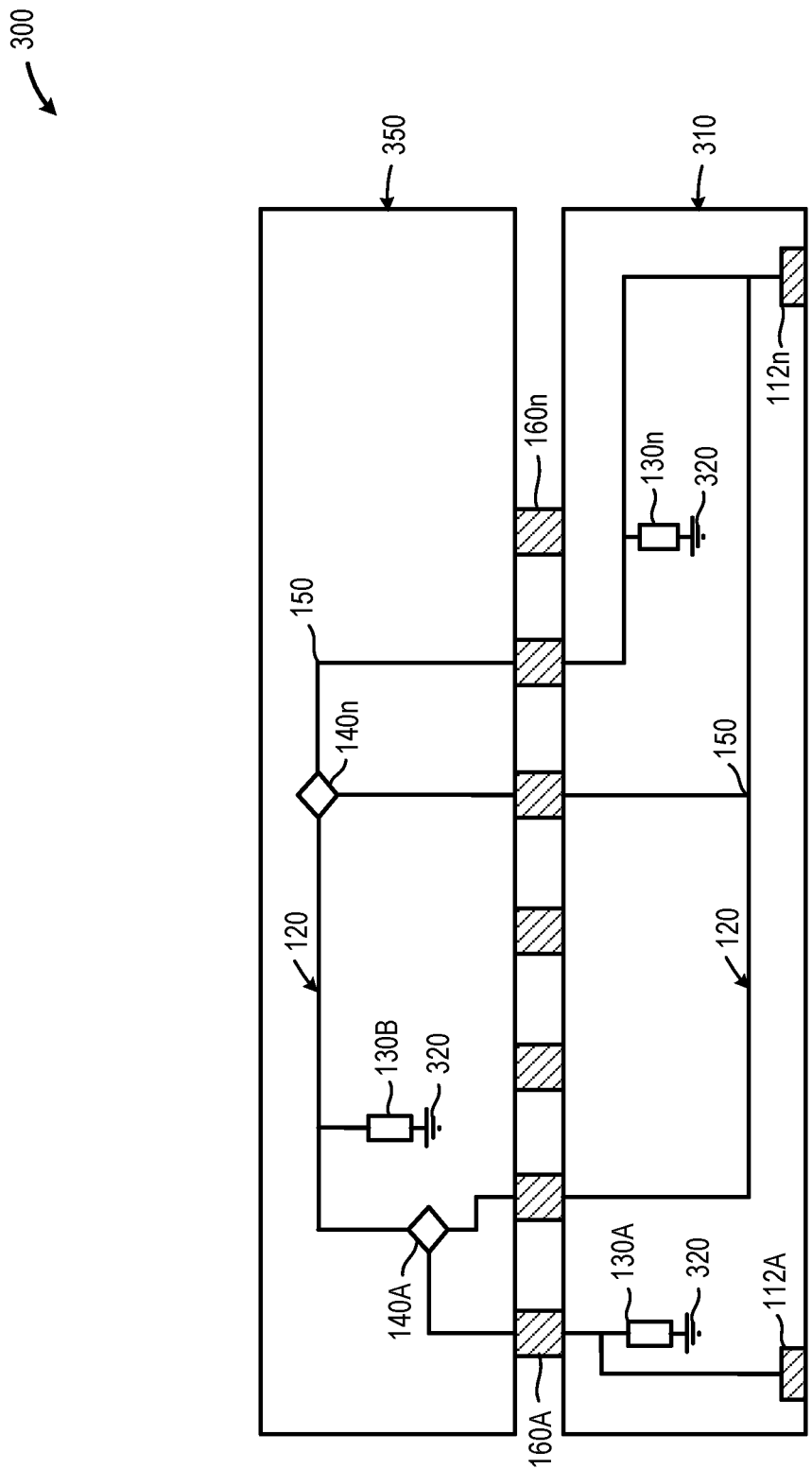
FIG. 3 is a schematic depicting an illustrative die stack that includes a first semiconductor die coupled via a number of interconnects to a second semiconductor die and in which each of the semiconductor dies includes one or more passive semiconductor components coupled to a chassis or earth ground and one or more switches, in accordance with at least one embodiment described herein.

FIG. 3 is a schematic depicting an illustrative die stack 300 that includes a first semiconductor die 310 coupled via a number of interconnects 160A-160n to a second semiconductor die 350 and in which each of the semiconductor dies includes one or more passive semiconductor components 130A-130n (collectively, "passive semiconductor components 130") coupled to a chassis or earth ground 320 and one or more switches 140A-140n (collectively, "switches 140"), in accordance with at least one embodiment described herein. As depicted in FIG. 3, in embodiments, the passive semiconductor components 130 may include components, such as capacitors, conductively coupled between the circuit 120 and an earth or chassis ground 320.

Figure 4:
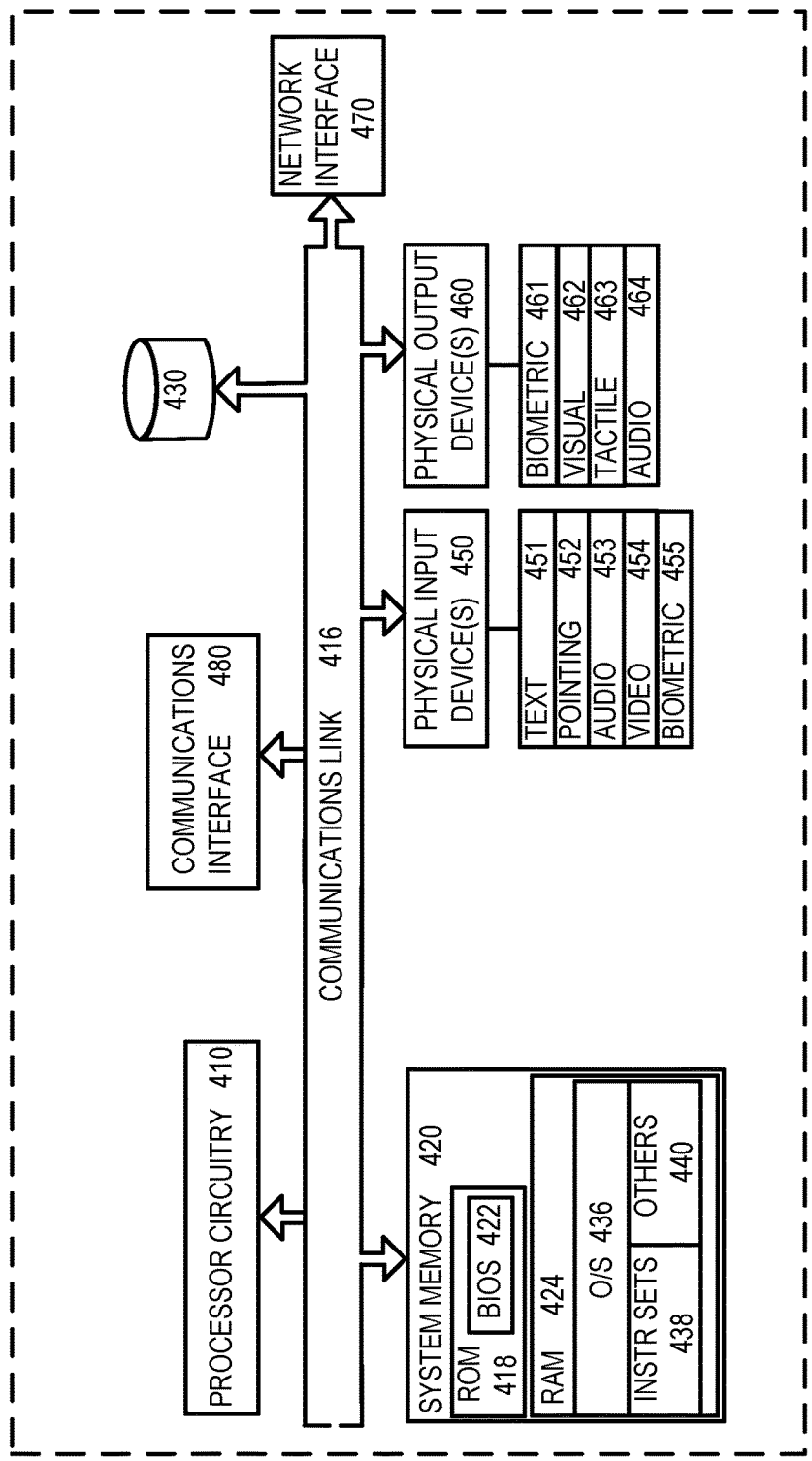
FIG. 4 is a block diagram of an illustrative processor-based device equipped with at least one semiconductor package that includes a plurality of semiconductor dies, each having one or more conductively coupled passive semiconductor component and one or more switches, in accordance with at least one embodiment described herein.

FIG. 4 is a block diagram of an illustrative processor-based device 400 equipped with at least one semiconductor package that includes a plurality of semiconductor dies, each having one or more conductively coupled passive semiconductor component 130 and one or more switches 140, in accordance with at least one embodiment described herein. The following discussion provides a brief, general description of the components forming the illustrative processor-based device 400 such as a smartphone, wearable computing device, portable computing device, or similar device that includes at least one stacked-die semiconductor package, such as a system-on-a-chip (SoC) that includes a plurality of selectively configurable, conductively coupled, passive semiconductor components 130 and/or switches 140 disposed across each of a plurality of semiconductor dies forming the semiconductor package.

The processor-based device 400 includes processor circuitry 410 capable of executing machine-readable instruction sets, reading data from a storage device 430 and writing data to the storage device 430. Those skilled in the relevant art will appreciate that the illustrated embodiments as well as other embodiments can be practiced with other circuit-based device configurations, including portable electronic or handheld electronic devices, for instance smartphones, portable computers, wearable computers, microprocessor-based or programmable consumer electronics, personal computers ("PCs"), network PCs, minicomputers, mainframe computers, and the like.

The processor circuitry 410 may include any number of hardwired or configurable circuits, some or all of which may include programmable and/or configurable combinations of electronic components, semiconductor devices, and/or logic elements that are disposed partially or wholly in a PC, server, or other computing system capable of executing machine-readable instructions. The processor-based device 400 includes the processor circuitry 410 and bus or similar communications link 416 that communicably couples and facilitates the exchange of information and/or data between various system components including a system memory 420, and/or one or more rotating data storage devices 430. The processor-based device 400 may be referred to in the singular herein, but this is not intended to limit the embodiments to a single device and/or system, since in certain embodiments, there will be more than one processor-based device 300 that incorporates, includes, or contains any number of communicably coupled, collocated, or remote networked circuits or devices.

The processor circuitry 410 may include any number, type, or combination of devices. At times, the processor circuitry 410 may be implemented in whole or in part in the form of semiconductor devices such as diodes, transistors, inductors, capacitors, and resistors. Such an implementation may include, but is not limited to any current or future developed single- or multi-core processor or microprocessor, such as: on or more systems on a chip (SOCs); central processing units (CPUs); digital signal processors (DSPs); graphics processing units (GPUs); application-specific integrated circuits (ASICs), field programmable gate arrays (FPGAs), and the like. Unless described otherwise, the construction and operation of the various blocks shown in FIG. 4 are of conventional design. Consequently, such blocks need not be described in further detail herein, as they will be understood by those skilled in the relevant art. The communications link 416 that interconnects at least some of the components of the processor-based device 400 may employ any known serial or parallel bus structures or architectures.

The system memory 420 may include read-only memory ("ROM") 418 and random access memory ("RAM") 424. A portion of the ROM 418 may be used to store or otherwise retain a basic input/output system ("BIOS") 422. The BIOS 422 provides basic functionality to the processor-based device 400, for example by causing the processor circuitry 410 to load one or more machine-readable instruction sets. In embodiments, at least some of the one or more machine-readable instruction sets cause at least a portion of the processor circuitry 410 to provide, create, produce, transition, and/or function as a dedicated, specific, and particular machine, for example a word processing machine, a digital image acquisition machine, and similar. In some implementations all or a portion of the system memory 420 may be disposed in a common semiconductor package with the processor circuitry, such as a system-on-a-chip, or SoC.

The processor-based device 400 may include one or more communicably coupled, non-transitory, data storage devices, such as one or more hard disk drives 430. The one or more data storage devices 430 may include any current or future developed storage appliances, networks, and/or devices. Non-limiting examples of such data storage devices 430 may include, but are not limited to, any current or future developed non-transitory storage appliances or devices, such as one or more magnetic storage devices, one or more optical storage devices, one or more electro-resistive storage devices, one or more molecular storage devices, one or more quantum storage devices, or various combinations thereof. In some implementations, the one or more data storage devices 430 may include one or more removable storage devices, such as one or more flash drives, flash memories, flash storage units, or similar appliances or devices capable of communicable coupling to and decoupling from the processor-based device 400.

The one or more data storage devices 430 may include interfaces or controllers (not shown) communicatively coupling the respective storage device or system to the communications link 416. The one or more data storage devices 430 may store, retain, or otherwise contain machine-readable instruction sets, data structures, program modules, data stores, databases, logical structures, and/or other data useful to the processor circuitry 410 and/or one or more applications executed on or by the processor circuitry 410. In some instances, one or more data storage devices 430 may be communicably coupled to the processor circuitry 410, for example via communications link 416 or via one or more wired communications interfaces (e.g., Universal Serial Bus or USB); one or more wireless communications interfaces (e.g., Bluetooth®, Near Field Communication or NFC); one or more wired network interfaces (e.g., IEEE 802.3 or Ethernet); and/or one or more wireless network interfaces (e.g., IEEE 802.11 or WiFi®).

Machine-readable instruction sets 438 and other modules 440 may be stored in whole or in part in the system memory 420. Such instruction sets 438 may be transferred, in whole or in part, from the one or more data storage devices 430. The instruction sets 438 may be loaded, stored, or otherwise retained in system memory 420, in whole or in part, during execution by the processor circuitry 410. The machine-readable instruction sets 438 may include machine-readable and/or processor-readable code, instructions, or similar logic capable of providing the speech coaching functions and capabilities described herein.

A system user may provide, enter, or otherwise supply commands (e.g., selections, acknowledgements, confirmations, and similar) as well as information and/or data (e.g., subject identification information, color parameters) to the processor-based device 400 using one or more communicably coupled input devices 450. The one or more communicably coupled input devices 450 may be disposed local to or remote from the processor-based device 400. The input devices 450 may include one or more: text entry devices 451 (e.g., keyboard); pointing devices 452 (e.g., mouse, trackball, touchscreen); audio input devices 453; video input devices 454; and/or biometric input devices 455 (e.g., fingerprint scanner, facial recognition, iris print scanner, voice recognition circuitry). In embodiments, at least some of the one or more input devices 450 may include a wired or wireless interface that communicably couples the input device 450 to the processor-based device 400.

The system user may receive output from the processor-based device 400 via one or more output devices 460. In at least some implementations, the one or more output devices 460 may include, but are not limited to, one or more: biometric output devices 461; visual output or display devices 462; tactile output devices 463; audio output devices 464, or combinations thereof. In embodiments, at least some of the one or more output devices 460 may include a wired or a wireless communicable coupling to the processor-based device 400.

For convenience, a network interface 470, the processor circuitry 410, the system memory 420, the one or more input devices 450 and the one or more output devices 460 are illustrated as communicatively coupled to each other via the communications link 416, thereby providing connectivity between the above-described components. In alternative embodiments, the above-described components may be communicatively coupled in a different manner than illustrated in FIG. 4. For example, one or more of the above-described components may be directly coupled to other components, or may be coupled to each other, via one or more intermediary components (not shown). In some embodiments, all or a portion of the communications link 416 may be omitted and the components are coupled directly to each other using suitable wired or wireless connections.

Figure 5:
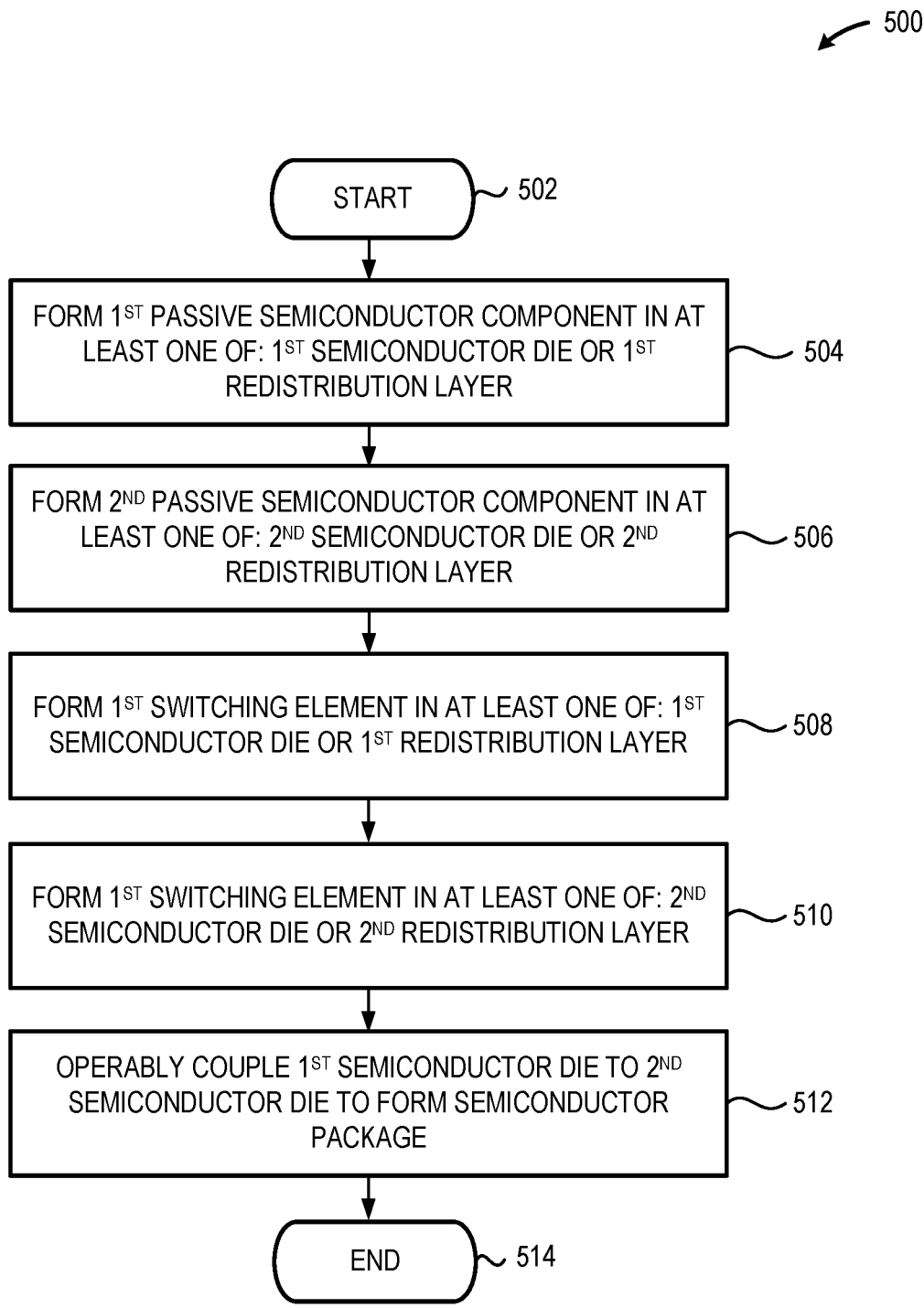
FIG. 5 is a high-level logic flow diagram of an illustrative method for fabricating an example semiconductor package that includes at least a first semiconductor die and a second semiconductor die, in accordance with at least one embodiment described herein.

FIG. 5 is a high-level logic flow diagram of an illustrative method 500 for fabricating an example semiconductor package that includes at least a first semiconductor die 110 and a second semiconductor die 170, in accordance with at least one embodiment described herein. The semiconductor package may include one or more circuits 120 formed using passive semiconductor components 130 and/or switches 140 that are disposed in either or both the first semiconductor die 110 and/or the second semiconductor die 170. In embodiments, the switches 140 may reversibly or irreversibly transition the passive semiconductor components 130 between a first operating state (e.g., conductively coupled to a circuit 120) and a second operating state (e.g., isolated from the circuit 120). The method 500 commences at 502.

At 504, a first passive semiconductor component 130A is deposited, patterned, or otherwise formed in, on, about, or across a first semiconductor die 110. In some implementations the first passive semiconductor component 130A may be deposited, patterned, or otherwise formed in, on, about, or across a first redistribution layer 230 that is disposed proximate a first semiconductor die 220. The first passive semiconductor component 130A may include, but is not limited to, a resistor, a capacitor, or an inductor. The first passive semiconductor component 130A may have any electrical value. The first passive semiconductor component 130A may be included in a plurality of passive semiconductor components 130 disposed in on, or about the first semiconductor die 110 and/or the first redistribution layer 230.

At 506, a second passive semiconductor component 130B is deposited, patterned, or otherwise formed in, on, about, or across a second semiconductor die 170. In some implementations the second passive semiconductor component 130B may be deposited, patterned, or otherwise formed in, on, about, or across a second redistribution layer 270 that is disposed proximate a second semiconductor die 260. The second passive semiconductor component 130B may include, but is not limited to, a resistor, a capacitor, or an inductor. The second passive semiconductor component 130B may have any electrical value. The second passive semiconductor component 130B may be included in a plurality of passive semiconductor components 130 disposed in on, or about the second semiconductor die 170 and/or the second redistribution layer 270.

At 508, a first switching element 140A is deposited, patterned, or otherwise formed in, on, about, or across a first semiconductor die 110. In some implementations the first switching element 140A may be deposited, patterned, or otherwise formed in, on, about, or across a first redistribution layer 230 that is disposed proximate a first semiconductor die 220. The first switching element 140A may include, but is not limited to, a mechanical switching element, an electromechanical switching element, an electromagnetic switching element, or a semiconductor switching element. The first switching element 140A may have one or more outputs. The first switching element 140A may include a selector switch or similar having a plurality of outputs. The first switching element 140A may be conductively coupled to the first passive semiconductor component 130A such that when the first switching element 140A is in a first state or mode, the first passive semiconductor component 130A is included in one or more circuits 120 and when the first switching element 140A is in a second state or mode, the first passive semiconductor component 130A is excluded from one or more circuits 120. In embodiments, the first switching element 140A may be manually transitioned from the first operating state or mode to the second operating mode or vice versa. In other embodiments, one or more control circuits may cause the first switching element 140A to autonomously transition from the first operating state or mode to the second operating mode or vice versa.

At 510, a second switching element 140B is deposited, patterned, or otherwise formed in, on, about, or across a second semiconductor die 170. In some implementations the second switching element 140B may be deposited, patterned, or otherwise formed in, on, about, or across a second redistribution layer 270 that is disposed proximate a second semiconductor die 260. The second switching element 140B may include, but is not limited to, a mechanical switching element, an electromechanical switching element, an electromagnetic switching element, or a semiconductor switching element. The second switching element 140B may have one or more outputs. The second switching element 140B may include a selector switch or similar having a plurality of outputs. The second switching element 140B may be conductively coupled to the second passive semiconductor component 130B such that when the second switching element 140B is in a first state or mode, the second passive semiconductor component 130B is included in one or more circuits 120 and when the second switching element 140B is in a second state or mode, the second passive semiconductor component 130B is excluded from one or more circuits 120. In embodiments, the second switching element 140B may be manually transitioned from the second operating state or mode to the second operating mode or vice versa. In other embodiments, one or more control circuits may cause the second switching element 140B to autonomously transition from the second operating state or mode to the second operating mode or vice versa. The second switching element 140B may be included in a plurality of switching elements disposed in on, or about the first semiconductor die 110, the second semiconductor die 170, the first redistribution layer 230, and/or the second redistribution layer 270.

At 512, the first semiconductor die 110 is operably coupled to the second semiconductor die 170. In some implementations, the plurality of interconnects 160 may conductively couple the first semiconductor die 110 to the second semiconductor die 170. In embodiments, the one or more circuits 120 containing the first passive semiconductor component 130A, the second passive semiconductor component 130B, the first switch 140A and the second switch 140B may pass between the first semiconductor die 110 and the second semiconductor die 170 via one or more interconnects 160. The method 500 concludes at 514.

Figure 6:
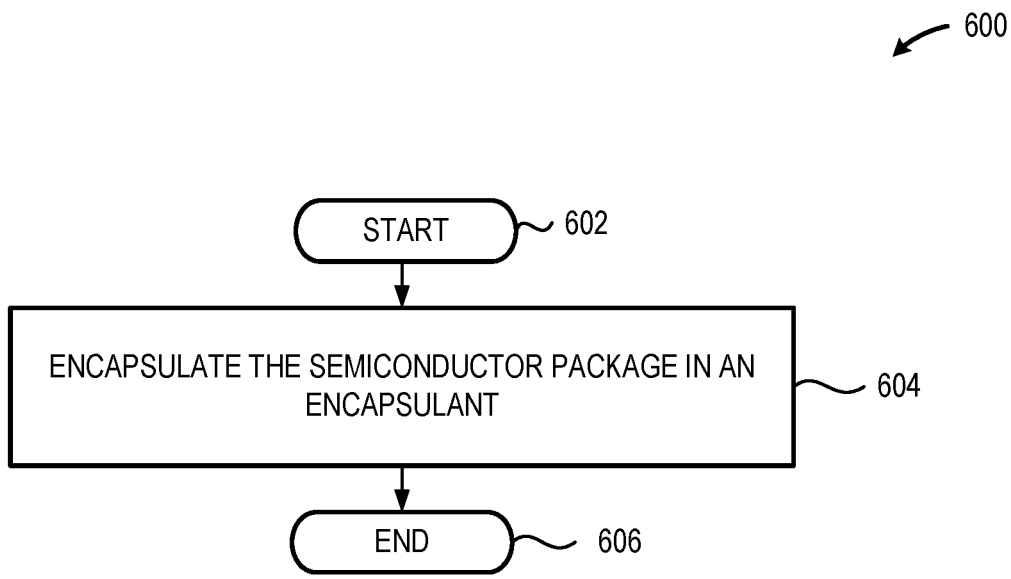
FIG. 6 is a high-level logic flow diagram of an illustrative method for encapsulating a stacked-die semiconductor package that includes at least a first semiconductor die and a second semiconductor die, in accordance with at least one embodiment described herein.

FIG. 6 is a high-level logic flow diagram of an illustrative method 600 for encapsulating a stacked-die semiconductor package 100 that includes at least a first semiconductor die 110 and a second semiconductor die 170, in accordance with at least one embodiment described herein. The method 600 may be used in conjunction with the method 500 described in FIG. 5. The method 600 commences at 602.

At 604, an encapsulant is disposed about the die stack containing the interconnected first semiconductor die 110 and second semiconductor die 170. The encapsulant may completely cover or encapsulate the die stack containing the interconnected first semiconductor die 110 and second semiconductor die 170. In embodiments, the encapsulant may be disposed about a perimeter of the topmost semiconductor die in the die stack. The method 600 concludes at 606.

Figure 7:
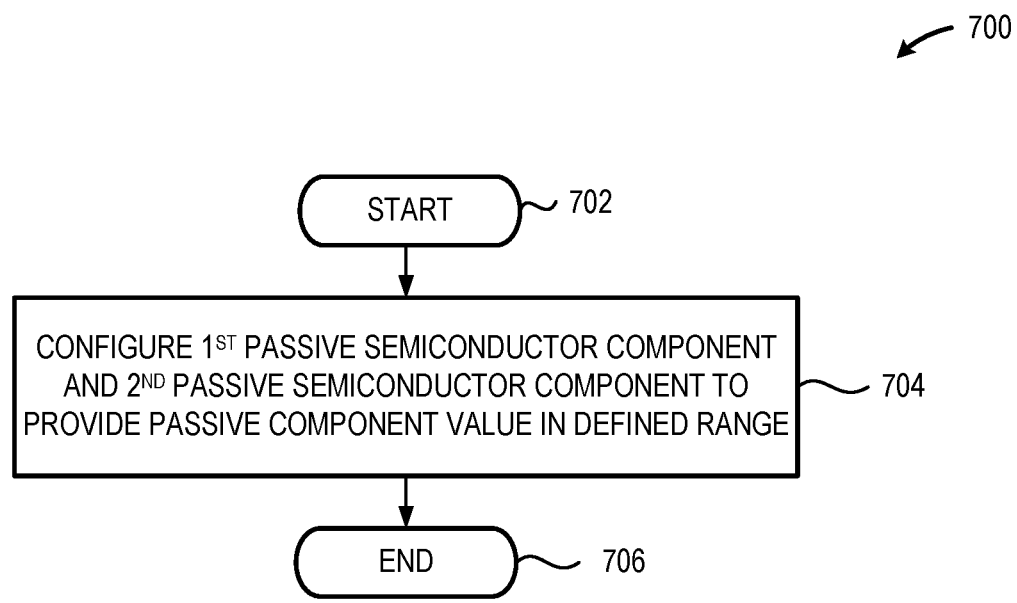
FIG. 7 is a high-level logic flow diagram of an illustrative method for generating a passive semiconductor component having defined electrical value using at least a first passive semiconductor component conductively coupled to a second passive semiconductor component via one or more switches, in accordance with at least one embodiment described herein.

FIG. 7 is a high-level logic flow diagram of an illustrative method 700 for generating a passive semiconductor component 130 having defined electrical value using at least a first passive semiconductor component 130A conductively coupled to a second passive semiconductor component 130B via one or more switches 140, in accordance with at least one embodiment described herein. The method 700 may be used in conjunction with the method 500 described in FIG. 5 and/or the method 600 described in FIG. 6. The method 700 commences at 702.

At 704, a first passive semiconductor component 130A, a second passive semiconductor component 130B, and one or more switches 140 may be conductively coupled using one or more conductive traces 150 to provide a circuit 120. In embodiments, the first passive semiconductor component 130A and the second passive semiconductor component 130B may be selectively configurable such that only the first passive semiconductor component 130A appears in the circuit 120, only the second passive semiconductor component 130B appears in the circuit, both the first passive semiconductor component 130A and the second passive semiconductor component 130B appear in series in the circuit 120, or, both the first passive semiconductor component 130A and the second passive semiconductor component 130B appear in parallel in the circuit 120. In embodiments, the switches 140 may be manually controlled or autonomously controlled by a control circuit or similar configurable system or device.

For example, the first passive semiconductor component 130A may be a 100Ω resistor and the second passive semiconductor component 130B may be a 500Ω resistor. By adjusting switches 140, resistances of 100Ω (first passive semiconductor component 130A); 300Ω (first and second passive semiconductor components 130A, 130B in parallel); 500Ω (second passive semiconductor component 130B); 600Ω (first and second passive semiconductor components 130A,130B in series). The method 700 concludes at 706.

Figure 8:
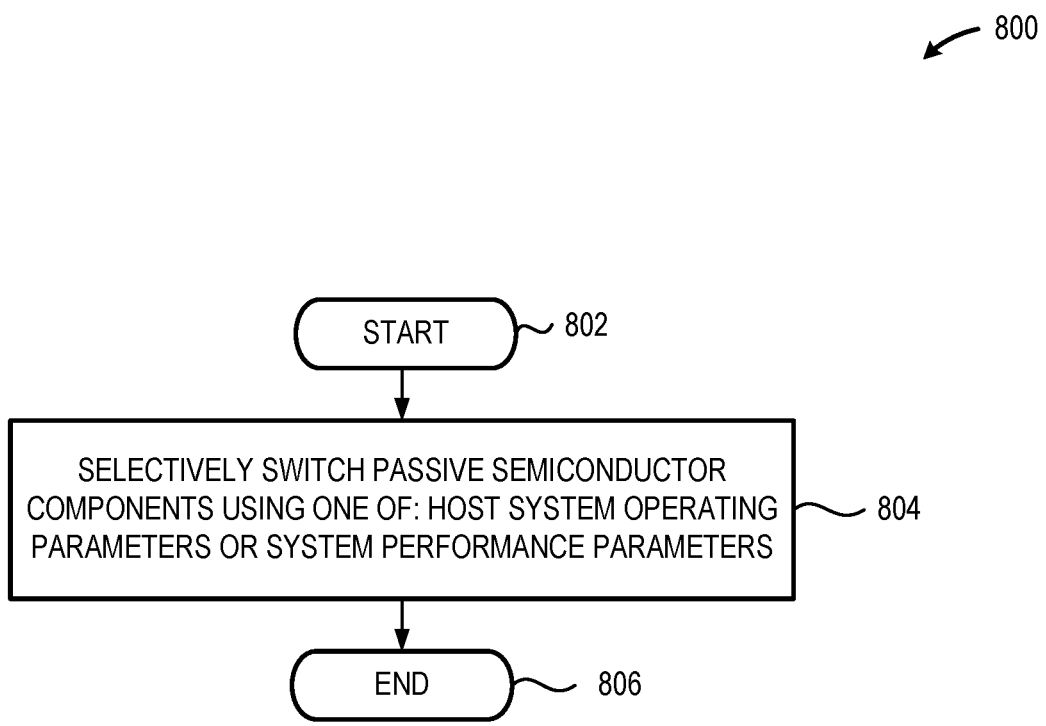
FIG. 8 is a high-level logic flow diagram of an illustrative method for autonomously configuring one or more circuits that includes a plurality of passive semiconductor components and a plurality of switches using a control circuit, processor, microprocessor, or controller, in accordance with at least one embodiment described herein.

FIG. 8 is a high-level logic flow diagram of an illustrative method 800 for autonomously configuring one or more circuits 120 that includes a plurality of passive semiconductor components 130 and a plurality of switches 140 using a control circuit, processor, microprocessor, or controller, in accordance with at least one embodiment described herein. The method 800 may be used in conjunction with the method 500 described in FIG. 5, the method 600 described in FIG. 6, and/or the method 700 described in FIG. 7. The method 800 commences at 802.

At 804, a control circuit autonomously and selectively positions some or all of a plurality of switches 140 to form a circuit 120 that includes at least some of a plurality of passive semiconductor components 130. In embodiments, the control circuit may periodically, aperiodically, continuously, or intermittently alter, adjust, or otherwise cause some or all of the switches 140 to transition operating states in response to receipt of one or more input signals that include information and/or data logically associated with one or more host system operating parameters (system temperature, CPU demand, memory demand, etc.). In other embodiments, the control circuit may periodically, aperiodically, continuously, or intermittently alter, adjust, or otherwise cause some or all of the switches 140 to transition operating states in response to receipt of one or more input signals that include information and/or data logically associated with one or more host system performance parameters (overclocking, enhanced CPU performance, enhanced GPU performance, etc.). The method 800 concludes at 806.

While FIGS. 5 through 8 illustrate various operations according to one or more embodiments, it is to be understood that not all of the operations depicted in FIGS. 5 through 8 are necessary for other embodiments. Indeed, it is fully contemplated herein that in other embodiments of the present disclosure, the operations depicted in FIGS. 5 through 8, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Any of the operations described herein may be implemented in a system that includes one or more mediums (e.g., non-transitory storage mediums) having stored therein, individually or in combination, instructions that when executed by one or more processors perform the methods. Here, the processor may include, for example, a server CPU, a mobile device CPU, and/or other programmable circuitry. Also, it is intended that operations described herein may be distributed across a plurality of physical devices, such as processing structures at more than one different physical location. The storage medium may include any type of tangible medium, for example, any type of disk including hard disks, floppy disks, optical disks, compact disk read-only memories (CD-ROMs), rewritable compact disks (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, Solid State Disks (SSDs), embedded multimedia cards (eMMCs), secure digital input/output (SDIO) cards, magnetic or optical cards, or any type of media suitable for storing electronic instructions. Other embodiments may be implemented as software executed by a programmable control device.

Thus, the present disclosure is directed to passive semiconductor components and switches or switching elements formed directly in, on, about, or across each of two or more semiconductor dies included in a stacked-die semiconductor package. In embodiments, at least some of the passive semiconductor components and/or switches may be formed in redistribution layers operably coupled to corresponding semiconductor dies included in the stacked-die semiconductor package. The switches may have multiple operating states and may be operably coupled to the passive semiconductor components such that one or more passive semiconductor components may be selectively included in one or more circuits or excluded from one or more circuits. The switches may be manually controlled or autonomously controlled using one or more control circuits. The one or more control circuits may receive one or more input signals containing host system information and/or data that is used to adjust or set the operating state of at least some of the switches.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for fabricating a semiconductor package containing at least a first semiconductor die and a second semiconductor die. A plurality of passive semiconductor components and a plurality of configurable switches are disposed across at least the first semiconductor die and the second semiconductor die. The switches may be disposed in operating states such that each of the passive semiconductor components are included in or excluded from a circuit formed on at least the first semiconductor die and the second semiconductor die.

According to example 1, there is provided a semiconductor package containing a multiple die system. The package may include: a first semiconductor die; a second semiconductor die communicably coupled to the first semiconductor die; and a plurality of passive semiconductor components, at least some of the plurality of passive semiconductor components disposed across the first semiconductor die and at least some of the plurality of passive semiconductor components disposed across the second semiconductor die; wherein, in operation, at least some of the plurality of passive semiconductor components on at least one of: the first semiconductor die or the second semiconductor die are selectively transitionable between a first state and a second state; wherein the first state couples the passive semiconductor component to a circuit that includes passive semiconductor components disposed on both the first semiconductor die and the second semiconductor die; and wherein the second state decouples the passive semiconductor component from the circuit.

Example 2 may include elements of example 1 where one or more selectable system operating parameters of the host system for the semiconductor package determine whether each of at least some of the plurality of passive semiconductor components are selectively switched to one of: the first state or the second state.

Example 3 may include elements of any of examples 1 or 2 where one or more autonomously determined system performance parameters of the host system for the semiconductor package determine whether each of at least some of the plurality of passive semiconductor components are selectively switched to one of: the first state or the second state.

Example 4 may include elements of any of examples 1 through 3 where the plurality of passive semiconductor components comprise any number or combination of resistors, capacitors, or inductors.

Example 5 may include elements of any of examples 1 through 4 where at least a portion of the plurality of semiconductor components have identical design values and different tolerance values.

Example 6 may include elements of any of examples 1 through 5 where at least a portion of the plurality of semiconductor components include a plurality of resistors, at least some of the plurality of resistors selectively switchable between the first state and the second state to provide an electrically coupled combination of resistors that provide a resistance value within a defined resistance range.

Example 7 may include elements of any of examples 1 through 6 where at least a portion of the plurality of semiconductor components include a plurality of inductors, at least some of the plurality of inductors selectively switchable between the first state and the second state to provide an electrically coupled combination of inductors that provide an inductance value within a defined inductance range.

Example 8 may include elements of any of examples 1 through 7 where at least a portion of the plurality of semiconductor components include a plurality of capacitors, at least some of the plurality of capacitors selectively switchable between the first state and the second state to provide an electrically coupled combination of capacitors that provide a capacitance value within a defined capacitance range.

Example 9 may include elements of any of examples 1 through 8 where at least a portion of the plurality of semiconductor components are disposed in a redistribution layer operably coupled to at least one of: the first semiconductor die or the second semiconductor die.

Example 10 may include elements of any of examples 1 through 9 where at least some of the plurality of semiconductor components are reversibly selectively transitionable between the first state and the second state.

Example 11 may include elements of any of examples 1 through 10, and the semiconductor package may further include: a plurality of switches, each of the plurality of switches to cause at least one of the plurality of passive semiconductor components to selectively transition between the first state and the second state; wherein at least some of the plurality of switches are disposed across the first semiconductor die and at least some of the plurality of switches are disposed across the second semiconductor die.

Example 12 may include elements of any of examples 1 through 11, and the semiconductor package may additionally include: control circuitry communicably coupled to the plurality of switches; wherein the control circuitry includes input circuitry to receive host system data from a host system of the semiconductor package; and wherein the control circuitry causes at least some of the plurality of switches to selectively transition at least some of the plurality of passive semiconductor components between the first state and the second state using the received host system data.

Example 13 may include elements of any of examples 1 through 12 where the received host system data includes data collected during a power-on self-test (POST) of the host system.

Example 14 may include elements of any of examples 1 through 13 where the received host system data includes data collected during operation of the host system.

Example 15 may include elements of any of examples 1 through 14, and the semiconductor package may additionally include one or more one-shot switching devices coupled to each of at least some of the plurality of passive semiconductor components, the one-shot switching devices to permanently and autonomously transition the respective passive semiconductor component between the first state and the second state.

Example 16 may include elements of any of examples 1 through 15 where the one-shot switching devices comprise one or more fusible links.

Example 17 may include elements of any of examples 1 through 16 where a host system for the semiconductor package autonomously configures the one-shot switching devices to place each of at least some of the plurality of passive semiconductor components are placed in the first state or the second state using one or more host system operating parameters.

Example 18 may include elements of any of examples 1 through 17 where a host system for the semiconductor package autonomously configures the one-shot switching devices to place each of at least some of the plurality of passive semiconductor components are placed in the first state or the second state using one or more semiconductor package operating parameters.

According to example 19, there is provided a method of fabricating a semiconductor package having selectively configurable passive semiconductor elements. The method may include: forming a first passive semiconductor component in a first semiconductor die, the first passive semiconductor component selectively transitionable between a first state and a second state; forming a second passive semiconductor component in a second semiconductor die, the second passive semiconductor component selectively transitionable between a first state and a second state; and conductively coupling the first passive semiconductor component and the second passive semiconductor component; wherein the first state couples the respective passive semiconductor component to the circuit; and wherein the second state decouples the respective passive semiconductor component from the circuit.

Example 20 may include elements of example 19, and the method may additionally include at least partially encapsulating the semiconductor package in an electrically non-conductive encapsulant.

Example 21 may include elements of any of examples 19 or 20, and the method may additionally include selectively configuring the first passive semiconductor element and the second passive semiconductor device to provide a passive component value in a defined range.

Example 22 may include elements of any of examples 19 through 21, and the method may additionally include selectively transitioning, when in operation, each of at least some of the plurality of passive semiconductor components between the first state and the second state based on at least one of: one or more selectable system operating parameters of a host system of the semiconductor package; or one or more autonomously determined system performance parameters of the host system of the semiconductor package.

Example 23 may include elements of any of examples 19 through 22 where selectively transitioning each of at least some of the plurality of passive semiconductor components between the first state and the second state further comprises: receiving by control circuitry communicably coupled to the first switching device and to the second switching device, host system data from a host system; and selectively transitioning each of at least some of the plurality of passive semiconductor components to one of: the first state or the second state using the received host system data.

Example 24 may include elements of any of examples 19 through 23 where receiving, by control circuitry, host system data from a host system comprises: receiving, by control circuitry, host system data from the host system during a power-on self-test (POST) of the host system.

Example 25 may include elements of any of examples 19 through 24 where receiving, by control circuitry, host system data from a host system comprises: receiving, by control circuitry, host system data that includes operational data collected during operation of the host system.

Example 26 may include elements of any of examples 19 through 25 where forming a first passive semiconductor component in a first semiconductor die may include forming at least one of: a resistor, a capacitor, or an inductor in the first semiconductor die; and where forming a second passive semiconductor component in a second semiconductor die may include forming at least one of: a resistor, a capacitor, or an inductor in the second semiconductor die.

Example 27 may include elements of any of examples 19 through 26, and the method may additionally include: forming a second passive semiconductor component in the first semiconductor die, wherein the first passive semiconductor component and the second passive semiconductor component have identical design values and different design tolerance values.

Example 28 may include elements of any of examples 19 through 27 where forming a first passive semiconductor component in a first semiconductor die may include: forming a first passive semiconductor component in a redistribution layer operably coupled to the first semiconductor die.

Example 29 may include elements of any of examples 19 through 28, and the method may additionally include: operably coupling the first semiconductor die to the second semiconductor die to provide a semiconductor package; forming at least one first switch in the semiconductor package, the at least one first switch operably coupled to the first passive semiconductor component to selectively transition the first passive semiconductor component between the first state and the second state; and forming at least one second switch in the semiconductor package, the at least one second switch operably coupled to the second passive semiconductor component to selectively transition the second passive semiconductor component between the first state and the second state.

Example 30 may include elements of any of examples 19 through 29 where forming at least one first switch in the semiconductor package may include forming at least one first solid-state switching device in the semiconductor package; and where forming at least one second switch in the semiconductor package may include forming at least one second solid-state switching device in the semiconductor package.

Example 31 may include elements of any of examples 19 through 30, and the method may additionally include: selectively transitioning, when in operation, each of at least some of the plurality of passive semiconductor components between the first state and the second state based, at least in part, on at least one of: one or more selectable system operating parameters of a host system of the semiconductor package; or one or more autonomously determined system performance parameters of the host system of the semiconductor package.

Example 32 may include elements of any of examples 19 through 31 where selectively transitioning each of at least some of the plurality of passive semiconductor components between the first state and the second state may further include: receiving by control circuitry communicably coupled to the first switching device and to the second switching device, host system data from a host system; and selectively transitioning each of at least some of the plurality of passive semiconductor components between the first state and the second state using the received host system data.

Example 33 may include elements of any of examples 19 through 32 where receiving, by control circuitry, host system data from the host system may include at least one of: receiving, by control circuitry, host system data from the host system during a power-on self-test (POST) of the host system; or
receiving, by control circuitry, host system data that includes operational data collected during operation of the host system.

Example 34 may include elements of any of examples 19 through 33 where forming at least one first switch in the semiconductor package may include: forming a one-shot switch operably coupled to first passive semiconductor component formed in the first semiconductor die, the one-shot switching device to permanently and autonomously transition the first passive semiconductor component between the first state and the second state.

Example 35 may include elements of any of examples 19 through 34 where forming a one-shot switch operably coupled to first passive semiconductor component formed in the first semiconductor die may include: forming a fusible link operably coupled to first passive semiconductor component formed in the first semiconductor die.

Example 36 may include elements of any of examples 19 through 35, and the method may additionally include: autonomously configuring, by a host system control circuit, the one-shot switching device to place the first passive semiconductor component in the first state or the second state based, at least in part, on one or more host system operating parameters.

According to example 37, there is provided a system for fabricating a semiconductor package having selectively configurable passive semiconductor elements. The system may include: means for forming a first passive semiconductor component in a first semiconductor die, the first passive semiconductor component selectively transitionable between a first state and a second state; means for forming a second passive semiconductor component in a second semiconductor die, the second passive semiconductor component selectively transitionable between a first state and a second state; and means for conductively coupling the first passive semiconductor component and the second passive semiconductor component; wherein the first state couples the respective passive semiconductor component to the circuit; and wherein the second state decouples the respective passive semiconductor component from the circuit.

Example 38 may include elements of example 37, and the system may additionally include: means for at least partially encapsulating the first semiconductor die and the second semiconductor die in an electrically non-conductive encapsulant.

Example 39 may include elements of any of examples 37 or 38, and the system may additionally include: means for selectively configuring the first passive semiconductor element and the second passive semiconductor device to provide a passive component value in a defined range.

Example 40 may include elements of any of examples 37 through 39, and the system may additionally include: means for selectively transitioning, when in operation, each of at least some of the plurality of passive semiconductor components between the first state and the second state based on at least one of: one or more selectable system operating parameters of a host system of the semiconductor package; or one or more autonomously determined system performance parameters of the host system of the semiconductor package.

Example 41 may include elements of any of examples 37 through 40 where the means for selectively transitioning each of at least some of the plurality of passive semiconductor components between the first state and the second state may further include: means for receiving by control circuitry communicably coupled to the first switching device and to the second switching device, host system data from a host system; and means for selectively transitioning each of at least some of the plurality of passive semiconductor components to one of: the first state or the second state using the received host system data.

Example 42 may include elements of any of examples 37 through 41 where the means for receiving, by control circuitry, host system data from a host system may include: means for receiving, by control circuitry, host system data from the host system during a power-on self-test (POST) of the host system.

Example 43 may include elements of any of examples 37 through 42 where the means for receiving, by control circuitry, host system data from a host system may include: means for receiving, by control circuitry, host system data that includes operational data collected during operation of the host system.

Example 44 may include elements of any of examples 37 through 43 where the means for forming a first passive semiconductor component in a first semiconductor die comprises means for forming at least one of: a resistor, a capacitor, or an inductor in the first semiconductor die; and where
the means for forming a second passive semiconductor component in a second semiconductor die comprises means for forming at least one of: a resistor, a capacitor, or an inductor in the second semiconductor die.

Example 45 may include elements of any of examples 37 through 44, and the system may additionally include: means for forming a second passive semiconductor component in the first semiconductor die, wherein the first passive semiconductor component and the second passive semiconductor component have identical design values and different design tolerance values.

Example 46 may include elements of any of examples 37 through 45 where the means for forming a first passive semiconductor component in a first semiconductor die may include: means for forming a first passive semiconductor component in a redistribution layer operably coupled to the first semiconductor die.

Example 47 may include elements of any of examples 37 through 46, and the system may additionally include: means for operably coupling the first semiconductor die to the second semiconductor die to provide a semiconductor package; means for forming at least one first switch in the semiconductor package, the at least one first switch operably coupled to the first passive semiconductor component to selectively transition the first passive semiconductor component between the first state and the second state; and means for forming at least one second switch in the semiconductor package, the at least one second switch operably coupled to the second passive semiconductor component to selectively transition the second passive semiconductor component between the first state and the second state.

Example 48 may include elements of any of examples 37 through 47 where the means for forming at least one first switch in the semiconductor package may include means for forming at least one first solid-state switching device in the semiconductor package; and where the means for forming at least one second switch in the semiconductor package may include means for forming at least one second solid-state switching device in the semiconductor package.

Example 49 may include elements of any of examples 37 through 48, and the system may additionally include: means for selectively transitioning, when in operation, each of at least some of the plurality of passive semiconductor components between the first state and the second state based, at least in part, on at least one of: one or more selectable system operating parameters of a host system of the semiconductor package; or one or more autonomously determined system performance parameters of the host system of the semiconductor package.

Example 50 may include elements of any of examples 37 through 49 where the means for selectively transitioning each of at least some of the plurality of passive semiconductor components between the first state and the second state may further include: means for receiving by control circuitry communicably coupled to the first switching device and to the second switching device, host system data from a host system; and means for selectively transitioning each of at least some of the plurality of passive semiconductor components between the first state and the second state using the received host system data.

Example 51 may include elements of any of examples 37 through 50 where the means for receiving, by control circuitry, host system data from the host system may include at least one of: means for receiving, by control circuitry, host system data from the host system during a power-on self-test (POST) of the host system; or means for receiving, by control circuitry, host system data that includes operational data collected during operation of the host system.

Example 52 may include elements of any of examples 37 through 51 where the means for forming at least one first switch in the semiconductor package may include: means for forming a one-shot switch operably coupled to first passive semiconductor component formed in the first semiconductor die, the one-shot switching device to permanently and autonomously transition the first passive semiconductor component between the first state and the second state.

Example 53 may include elements of any of examples 37 through 52 where the means for forming a one-shot switch operably coupled to first passive semiconductor component formed in the first semiconductor die may include: means for forming a fusible link operably coupled to first passive semiconductor component formed in the first semiconductor die.

Example 54 may include elements of any of examples 37 through 53, and the system may additionally include: means for autonomously configuring, by a host system control circuit, the one-shot switching device to place the first passive semiconductor component in the first state or the second state based, at least in part, on one or more host system operating parameters.

According to example 55, there is provided an electronic device. The electronic device may include: a printed circuit board; and a semiconductor package operably coupled to the printed circuit board, the semiconductor package including: a first semiconductor die; a second semiconductor die communicably coupled to the first semiconductor die; and a plurality of passive semiconductor components, at least some of the plurality of passive semiconductor components disposed across the first semiconductor die and at least some of the plurality of passive semiconductor components disposed across the second semiconductor die; where, in operation, at least some of the plurality of passive semiconductor components on at least one of: the first semiconductor die or the second semiconductor die are selectively transitionable between a first state and a second state; where the first state couples the passive semiconductor component to a circuit that includes passive semiconductor components disposed on both the first semiconductor die and the second semiconductor die; and where the second state decouples the passive semiconductor component from the circuit.

Example 56 may include elements of example 55 where one or more selectable operating parameters of the electronic device determine whether each of at least some of the plurality of passive semiconductor components are selectively transitioned between the first state and the second state.

Example 57 may include elements of any of examples 55 through 56 where one or more autonomously determined performance parameters of the electronic device determine whether each of at least some of the plurality of passive semiconductor components are selectively switched to one of: the first state or the second state.

Example 58 may include element of any of examples 55 through 57 where the plurality of passive semiconductor components may include any number or combination of resistors, capacitors, or inductors.

Example 59 may include elements of any of examples 55 through 58 where at least a portion of the plurality of semiconductor components have identical design values and different tolerance values.

Example 60 may include elements of any of examples 55 through 59 where at least a portion of the plurality of semiconductor components include a plurality of resistors, at least some of the plurality of resistors selectively switchable between the first state and the second state to provide an electrically coupled combination of resistors that provide a resistance value within a defined resistance range.

Example 61 may include elements of any of examples 55 through 60 where at least a portion of the plurality of semiconductor components include a plurality of inductors, at least some of the plurality of inductors selectively switchable between the first state and the second state to provide an electrically coupled combination of inductors that provide an inductance value within a defined inductance range.

Example 62 may include elements of any of examples 55 through 61 where at least a portion of the plurality of semiconductor components include a plurality of capacitors, at least some of the plurality of capacitors selectively switchable between the first state and the second state to provide an electrically coupled combination of capacitors that provide a capacitance value within a defined capacitance range.

Example 63 may include elements of any of examples 55 through 62 where at least a portion of the plurality of semiconductor components are disposed in a redistribution layer operably coupled to at least one of: the first semiconductor die or the second semiconductor die.

Example 64 may include elements of any of examples 55 through 63 where at least some of the plurality of semiconductor components are reversibly selectively switchable between the first state and the second state.

Example 65 may include elements of any of examples 55 through 64 where the semiconductor package may further include: a plurality of switches, each of the plurality of switches to cause at least one of the plurality of passive semiconductor components to selectively transition between the first state and the second state; where at least some of the plurality of switches are disposed across the first semiconductor die and at least some of the plurality of switches are disposed across the second semiconductor die.

Example 66 may include elements of any of examples 55 through 65 where the semiconductor package may further include: control circuitry communicably coupled to the plurality of switches; where the control circuitry includes input circuitry to receive host system data from a host system of the semiconductor package; and where the control circuitry causes at least some of the plurality of switches to selectively transition at least some of the plurality of passive semiconductor components between the first state and the second state using the received electronic device data.

Example 67 may include elements of example 66 where the received electronic device data includes data collected during a power-on self-test (POST) of the electronic device.

Example 68 may include elements of any of examples 55 through 66 where the received electronic device data includes data collected during operation of the electronic device.

Example 69 may include elements of any of examples 55 through 64 where the semiconductor package may further include: one or more one-shot switching devices coupled to each of at least some of the plurality of passive semiconductor components, the one-shot switching devices to permanently and autonomously transition the respective passive semiconductor component between the first state and the second state.

Example 70 may include elements of any of examples 55 through 69 where the one-shot switching devices may include one or more fusible links.

Example 71 may include elements of any of examples 55 through 70 where the electronic device autonomously configures the one-shot switching devices to place each of at least some of the plurality of passive semiconductor components are placed in the first state or the second state using one or more host system operating parameters.

Example 72 may include elements of any of examples 55 through 71 where the electronic device autonomously configures the one-shot switching devices to place each of at least some of the plurality of passive semiconductor components are placed in the first state or the second state using one or more semiconductor package operating parameters.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A semiconductor package, comprising:
a first semiconductor die;
a second semiconductor die communicably coupled to the first semiconductor die; and
a plurality of passive semiconductor components, at least some of the plurality of passive semiconductor components disposed across the first semiconductor die and at least some of the plurality of passive semiconductor components disposed across the second semiconductor die;
wherein, in operation, at least some of the plurality of passive semiconductor components on at least one of: the first semiconductor die or the second semiconductor die are selectively transitionable between a first state and a second state;

wherein the first state couples the passive semiconductor component to a circuit that includes passive semiconductor components disposed on both the first semiconductor die and the second semiconductor die;

wherein the second state decouples the passive semiconductor component from the circuit.

2. The semiconductor package of claim 1 wherein at least some of the plurality of semiconductor components are reversibly selectively switchable between the first state and the second state.

3. The semiconductor package of claim 1 wherein one or more system operating parameters of a host system that includes the semiconductor package determine whether each of at least some of the plurality of passive semiconductor components are selectively transitioned between the first state and the second state.

4. The semiconductor package of claim 1 wherein one or more system performance parameters of a host system that includes the semiconductor package determine whether each of at least some of the plurality of passive semiconductor components are selectively transitioned between the first state and the second state.

5. The semiconductor package of claim 1 wherein the plurality of passive semiconductor components comprise any number or combination of resistors, capacitors, or inductors.

6. The semiconductor package of claim 5 wherein at least a portion of the plurality of semiconductor components have similar electrical values and different tolerance values.

7. The semiconductor package of claim 5 wherein at least a portion of the plurality of semiconductor components include a plurality of resistors, at least some of the plurality of resistors selectively switchable between the first state and the second state to provide a conductively coupled combination of resistors that provide a resistance value within a defined resistance range.

8. The semiconductor package of claim 5 wherein at least a portion of the plurality of semiconductor components include a plurality of inductors, at least some of the plurality of inductors selectively switchable between the first state and the second state to provide a conductively coupled combination of inductors that provide an inductance value within a defined inductance range.

9. The semiconductor package of claim 5 wherein at least a portion of the plurality of semiconductor components include a plurality of capacitors, at least some of the plurality of capacitors selectively switchable between the first state and the second state to provide a conductively coupled combination of capacitors that provide a capacitance value within a defined capacitance range.

10. The semiconductor package of claim 1 wherein at least a portion of the plurality of semiconductor components are disposed in a redistribution layer operably coupled to at least one of: the first semiconductor die or the second semiconductor die.

11. The semiconductor package of claim 1, further comprising:

a plurality of switches, each of the plurality of switches to cause at least one of the plurality of passive semiconductor components to selectively transition between the first state and the second state;

wherein at least some of the plurality of switches are disposed across the first semiconductor die and at least some of the plurality of switches are disposed across the second semiconductor die.

12. The semiconductor package of claim 11, further comprising:

control circuitry communicably coupled to the plurality of switches;

wherein the control circuitry includes input circuitry to receive host system data from a host system of the semiconductor package; and wherein the control circuitry causes at least some of the plurality of switches to selectively transition at least some of the plurality of passive semiconductor components between the first state and the second state using the received host system data.

13. The semiconductor package of claim 12 wherein the received host system data includes at least one of:

data collected during a power-on self-test (POST) of the host system; or data collected during operation of the host system.

* * * * *